(12) United States Patent
Ripley et al.

(10) Patent No.: US 8,644,777 B2
(45) Date of Patent: Feb. 4, 2014

(54) SYSTEM AND METHOD FOR POWER AMPLIFIER OVER-VOLTAGE PROTECTION

(75) Inventors: David S. Ripley, Marion, IA (US); Joel A. Penticoff, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 481 days.

(21) Appl. No.: 12/775,675

(22) Filed: May 7, 2010

(65) Prior Publication Data

US 2011/0275330 A1  Nov. 10, 2011

(51) Int. Cl.
*H04B 1/04* (2006.01)

(52) U.S. Cl.
USPC ........ 455/117; 455/126; 455/127.1; 330/133; 330/141; 330/298; 330/279; 330/207 P

(58) Field of Classification Search
USPC ........ 455/522, 67.11, 572, 573, 115.1, 115.3, 455/115.4, 126, 127.1, 127.2, 127.3, 117; 330/207 P, 297, 298, 133, 141
See application file for complete search history.

(56) References Cited

U.S. PATENT DOCUMENTS

| | | | | |
|---|---|---|---|---|
| 4,821,000 A | * | 4/1989 | Imanishi | 330/298 |
| 5,589,796 A | * | 12/1996 | Alberth et al. | 330/133 |
| 6,580,321 B1 | * | 6/2003 | Arell et al. | 330/207 P |
| 7,605,652 B2 | * | 10/2009 | Beaulaton et al. | 330/141 |

* cited by examiner

*Primary Examiner* — Junpeng Chen
(74) *Attorney, Agent, or Firm* — Knobbe, Martens, Olson & Bear, LLP

(57) ABSTRACT

A system for power amplifier over-voltage protection includes a power amplifier configured to receive a system voltage, a bias circuit configured to provide a bias signal to the power amplifier, and a power amplifier over-voltage circuit configured to interrupt the bias signal when the system voltage exceeds a predetermined value, while the system voltage remains coupled to the power amplifier.

23 Claims, 5 Drawing Sheets

SYSTEM AND METHOD FOR POWER AMPLIFIER OVER-VOLTAGE PROTECTION

BACKGROUND

Portable communication devices, such as cellular telephones, personal digital assistants (PDAs), WiFi transceivers, and other communication devices transmit and receive communication signal at various frequencies that correspond to different communication bands and at varying power levels. These devices rely on a portable power source, such as a battery, to power the device. In some instances, it is possible for the voltage supplied by the power source to exceed the operational parameters of the device, particularly, the power amplifier. For example, a charging device may be connected to the power source to power the device or to charge the power source. Inconsistencies in the charging device, or the source that powers the charging device, may lead to a condition where the power source provides excessive voltage to the portable communication device. Such an over-voltage condition can damage the portable communication device, particularly, the power amplifier.

Therefore, in such over-voltage circumstances it is desirable to disable the power amplifier within the portable communication device to prevent damage to the device.

SUMMARY

Embodiments of a system for power amplifier over-voltage protection include a power amplifier configured to receive a system voltage, a bias circuit configured to provide a bias signal to the power amplifier, and a power amplifier over-voltage circuit configured to interrupt the bias signal when the system voltage exceeds a predetermined value, while the system voltage remains coupled to the power amplifier.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable communication device, such as a portable cellular telephone or a personal digital assistant (PDA), the system and method for power amplifier over-voltage protection can be used in any device or system that has a power amplifier. The system and method for power amplifier over-voltage protection can be implemented as part of an integrated module that contains other circuit elements, or can be implemented as a discrete power amplification control module.

In an embodiment, the system and method for power amplifier over-voltage protection can be implemented in hardware. The hardware implementation of the system and method for power amplifier over-voltage protection can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc.

Figure 1:
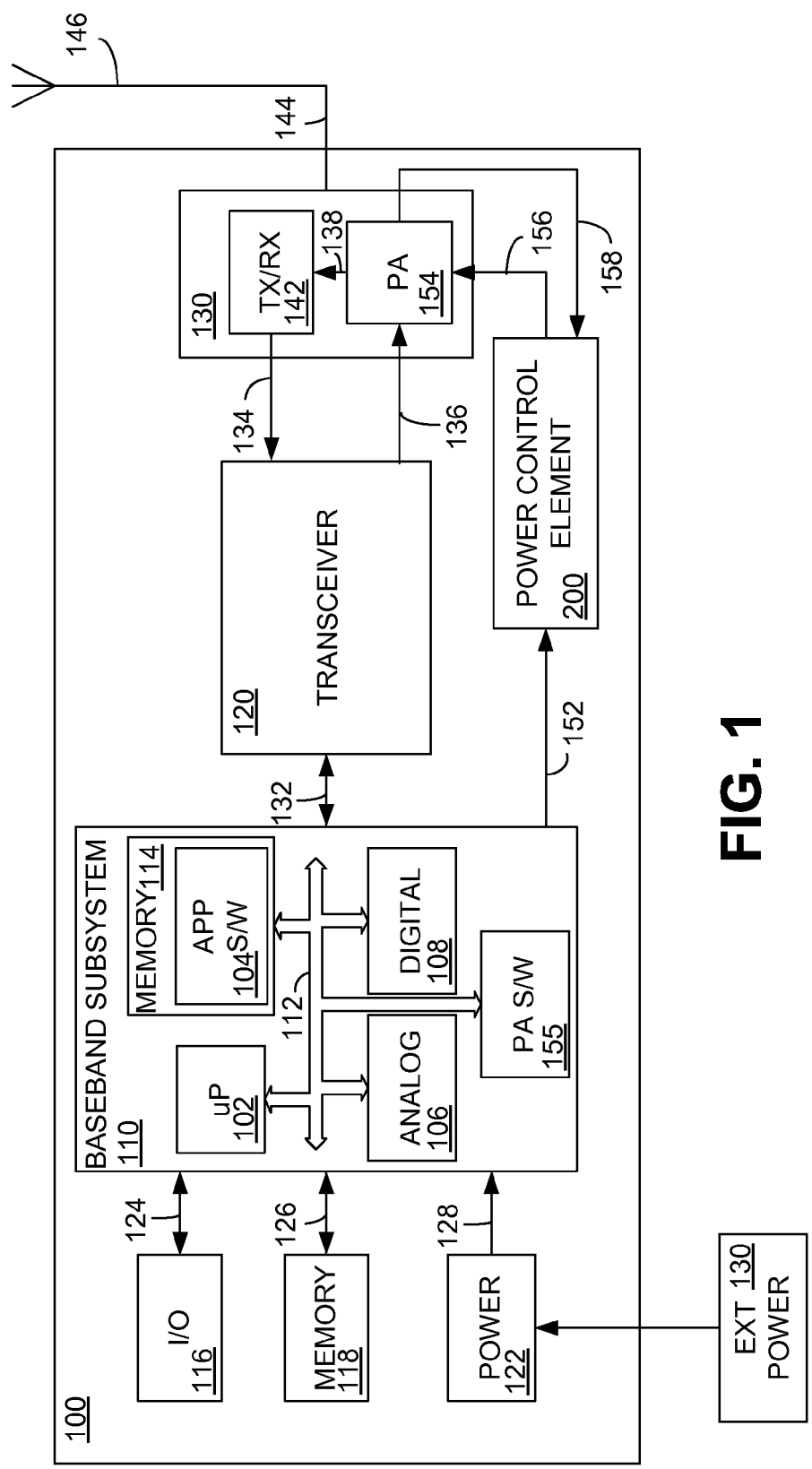
FIG. 1 is a block diagram illustrating a simplified portable communication device.

FIG. 1 is a block diagram illustrating a simplified portable communication device 100. In an embodiment, the portable communication device 100 can be a portable cellular telephone. Embodiments of the system and method for power amplifier over-voltage protection can be implemented in any device having an RF power amplifier, and in this example, are implemented in a portable communication device 100. The portable communication device 100 illustrated in FIG. 1 is intended to be a simplified example of a cellular telephone and to illustrate one of many possible applications in which the system and method for power amplifier over-voltage protection can be implemented. One having ordinary skill in the art will understand the operation of a portable cellular telephone, and, as such, implementation details are not shown herein. The portable communication device 100 includes a baseband subsystem 110, a transceiver 120, a front end module (FEM) 130 and a power control element 200. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108, and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110 over connection 128. The I/O element 116 can include, for example, a microphone, a keypad, a speaker, a pointing device, user interface control elements, and any other devices or system that allow a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100.

In some embodiments, an external power source 130 can be coupled to the power source 122, or can be coupled directly to the portable communication device 100. The external power source 130 can be, for example, an alternating current (AC) power adaptor or charger, a direct current (DC) vehicle adaptor or charger, or another external power source. It is possible that the external power source 130 can cause an over-voltage supply condition within the portable communication device 100. For example, in the case of an AC adaptor or charger, the external power source 130 can be susceptible to voltage conditions at an AC input that may cause the external power source 130 to supply a greater than designed voltage to the portable communication device 100. Similarly, in the case of a DC vehicle adaptor or charger, the external power source 130 can be susceptible to voltage conditions on the DC input that may cause the external power source 130 to supply a greater than designed voltage to the portable communication device 100. In other examples, the fabrication and quality control of the external power source 130 may be such that it allows a greater than designed voltage to be supplied to the portable communication device 100, regardless of the AC or DC input power conditions. As will be described below, in such instances it is desirable to have a way to protect the power amplifier within the portable communication device from such supply voltage inconsistencies and fluctuations.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the system and method for power amplifier over-voltage protection are implemented in software, then the baseband subsystem 110 also includes power amplifier software 155, which may cooperate with control logic that can be executed by the microprocessor 102, or by another processor, to control the operation of at least portions of the power amplifier 154 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 154. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 154. The output of the power amplifier 154 is provided over connection 138 to the TX/RX switch 142, and then to an antenna 146 over connection 144.

The power control element 200 includes circuitry and logic that controls the power output of the power amplifier 154. In an embodiment, the power control element 200 receives a power control signal from the baseband subsystem 110 over connection 152. The power control signal on connection 152 can be implemented in a variety of ways, and generally includes an analog or a digital control signal that allows the power control element 200 to determine and set the output of the power amplifier 154. In an embodiment, the power control element 200 can also receive a feedback signal from the power amplifier 154 over connection 158. The feedback signal over connection 158 can be generated in a variety of ways to indicate the relative power output of the power amplifier 154. Embodiments of the power control element 200 will be described in greater detail below.

A signal received by the antenna 146 is provided over connection 144 to the TX/RX switch 142, which provides the received signal over connection 134 to the transceiver 120.

In an embodiment, the baseband subsystem 110 provides a power, or mode selection, signal over connection 152 to the power amplifier 200. The mode selection signal determines whether one or more amplification paths within the power amplifier 200 are enabled.

Figure 2:
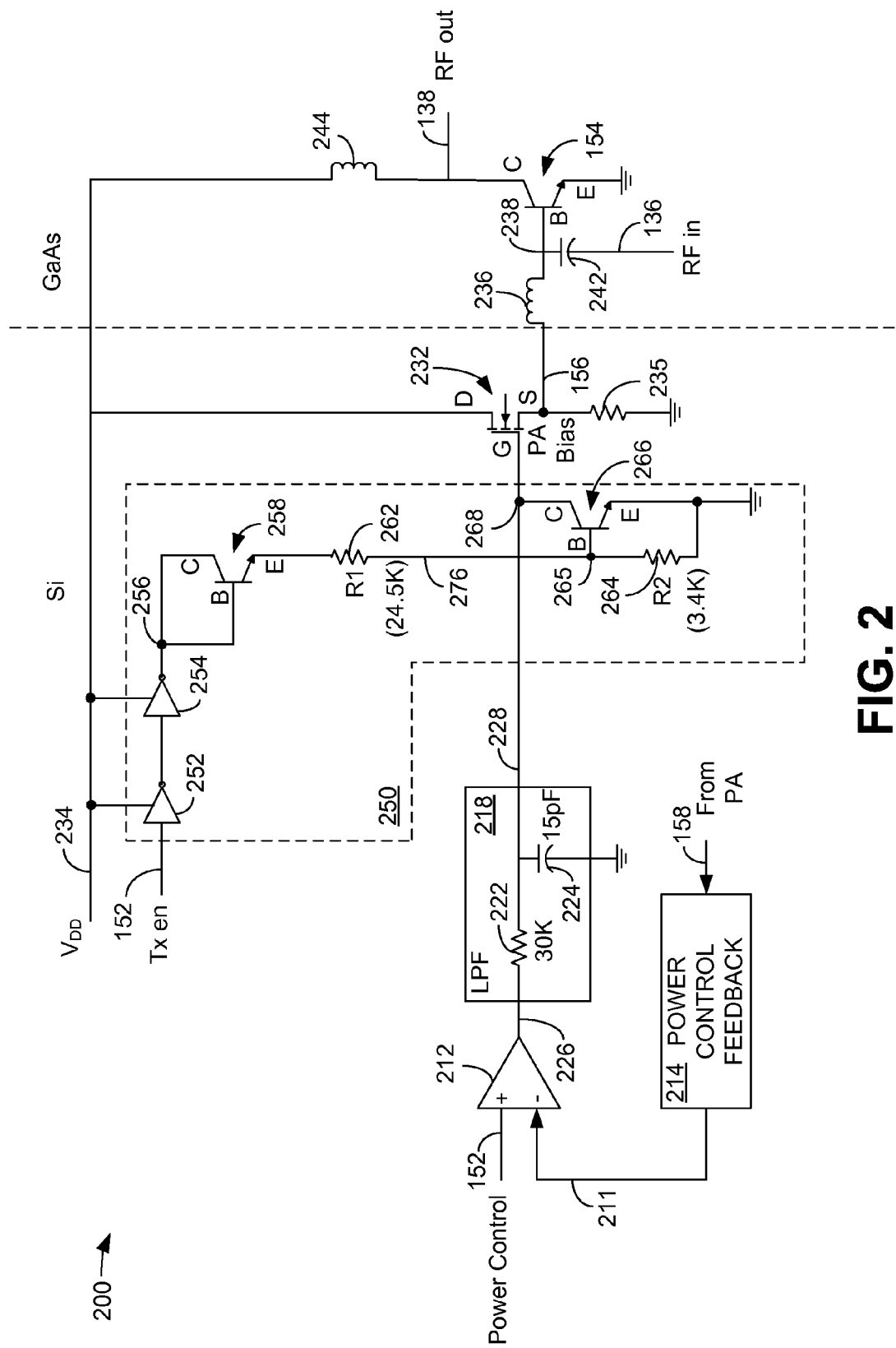
FIG. 2 is a diagram illustrating an embodiment of the power control element and power amplifier of FIG. 1.

FIG. 2 is a diagram illustrating an embodiment of the power control element 200 and power amplifier 154 of FIG. 1. FIG. 2 illustrates only the portions of the power control element 200 that are relevant to the description of the system and method for power amplifier over-voltage protection. The power control element 200 includes a comparator 212, which receives a power control signal from the baseband subsystem 110 over connection 152 at a non-inverting input and which receives a power feedback signal over connection 211 at an inverting input. In an embodiment, the comparator 212 can be implemented with an operational amplifier having an inverting and a non-inverting input and which develops an error signal that represents the difference between the inverting and non-inverting inputs.

The power feedback signal on connection 211 is provided by a power control feedback element 214. The power control feedback element 214 receives a signal over connection 158 indicative of the power provided by the power amplifier 154. The exact architecture of the power control feedback element 214 is dependent upon the manner of implementation. For example, in an embodiment, the power control feedback element 214 can include circuitry designed to sense the current being supplied to the power amplifier 154 by determining a voltage across a resistor (not shown) in the power supply provided to the power amplifier 154. Alternatively, the power control feedback element 214 can include circuitry, such as a radio frequency power detector (e.g., a diode detector), which provides a relative measure of the radio frequency output power of the power amplifier 154.

Regardless of the manner in which the power control feedback element 214 develops the power feedback signal on connection 211, the comparator 212 provides a power amplifier control signal on connection 226. In an embodiment, the power control signal on connection 152 is compared against the power feedback signal on connection 211, such that the comparator 212 develops an error signal on connection 226 representing the difference between the signals on connections 152 and 211. As known by those skilled in the art, the comparator 212 uses the power feedback signal on connection 211 and the power control signal on connection 152 to provide a power amplifier control signal on connection 226. After additional processing, the power amplifier control signal on connection 226 causes the power amplifier 154 to provide a radio frequency (RF) signal on connection 138 having a power that approximates, or that is proportional to, the power control signal on connection 152.

The power amplifier control signal on connection 226 is provided to a filter 218. In an embodiment, the filter 218 is a low pass filter, and thus minimizes noise and stabilizes the signal on connection 226. In an embodiment, the filter 218 includes a resistor 222 and a capacitor 224. In an exemplary embodiment, the value of the resistor 222 can be 30 kiloohms (KΩ) and the value of the capacitor 224 can be 15 picofarads (pF).

The filtered power amplifier control signal on connection 228 is provided to the gate terminal a transistor 232. In an embodiment, the transistor 232 can be implemented as a native n-type field effect transistor (FET). The characteristics of a native N-FET include a threshold voltage near zero and nearly equal gate and source voltages, which provide a high voltage swing. However, the transistor 232 may also be implemented as a p-type FET. The gate terminal of the transistor 232 is coupled to the collector terminal of a transistor 266 at node 268. The node 268 is a high-impedance point and provides a suitable location for the insertion of the power amplifier over-voltage disable circuit 250.

The signal on the source terminal of the transistor 232 closely matches the level of the signal on the gate terminal of the transistor 232, where it is applied as the power amplifier bias control signal on connection 156. The power amplifier bias control signal on connection 156 is provided through an inductor 236 to the base terminal 238 of the power amplifier 154. Although shown as a single transistor, the power amplifier 154 is typically implemented using a number of amplifier stages. In a typical implementation, a transistor output stage is driven by one or two driver stages, each of which receive the power amplifier bias control signal at their base terminals on connection 238, while the output stage of the power amplifier 154 is provided as a third stage. However, all such multiple and single stage implementations are considered within the scope of this description.

A radio frequency (RF) input signal is provided from connection 136, through a DC blocking capacitor 242 to the base terminal 238 of the power amplifier 154. The collector terminal of the power amplifier 154 provides the radio frequency output signal on connection 138. The collector terminal of the power amplifier 154 is also coupled through an inductor 244 to a system voltage source, $V_{DD}$, on connection 234. The system voltage, $V_{DD}$, is typically the DC voltage provided to the portable communication device 100 by the power source 122 (FIG. 1). In an embodiment, the voltage $V_{DD}$ on connection 234 can be the system battery voltage, or, in alternative embodiments, can be a regulated voltage that is driven by the battery voltage.

The power amplifier control element 210 also includes a power amplifier over-voltage disable circuit 250. In an embodiment, the power amplifier over-voltage disable circuit 250 includes an inverter 252 coupled to an inverter 254. The inverters 252 and 254 can be implemented as complementary metal oxide semiconductor (CMOS) devices. The input signal to the inverter 252 is the transmit enable (Tx en) signal provided from the baseband subsystem 110 over connection 152. The inverter 252 and the inverter 254 also receive the system voltage, $V_{DD}$, over connection 234. When the transmit enable signal on connection 152 is logic high, the inverter 254 provides the system voltage, $V_{DD}$, from connection 234 directly onto node 256.

The power amplifier over-voltage disable circuit 250 includes transistors 258 and 266, and resistors 262 and 264. As mentioned above, the collector terminal of the transistor 266 is coupled via node 268 to the gate terminal of the transistor 232. When forward biased, the transistor 266 becomes conducting and a voltage drop $V_{BE}$, appears across the base to emitter junction of the transistor 266. This voltage drop, $V_{BE}$, also appears across the resistor 264. In an embodiment, the value of the resistor 264 is approximately 3.4 K/Ω. Therefore, the current flowing through the resistor 264 is $V_{BE}/3.4$ KΩ. In a typical silicon bipolar junction transistor (BJT) process by which the transistor 266 is fabricated, a typical $V_{BE}$ is 0.6V that decreases with increasing temperature. The temperature characteristic of the $V_{BE}$ of the transistor 266 can be used to compensate for the variability of the threshold at which the power amplifier over-voltage disable circuit 250 operates.

As long as the transistor 266 is conducting, the current flowing through resistor 264 also flows through the resistor 262. In an embodiment, the value of the resistor 262 is approximately 24.5 KΩ. Therefore, the voltage drop across the resistor 262 is equal to 24.5/3.4, or approximately 7.2 times the voltage drop, $V_{BE}$, across the resistor 264. The resistors 262 and 264 form a $V_{BE}$ multiplier that exhibits a threshold at 8.2 $V_{BE}$. The voltage drop across resistor 262 is 7.2 $V_{BE}$, which is added to the voltage drop across the resistor 264, resulting in 8.2 $V_{BE}$. Viewed alternatively, resistors 262 and 264 form a voltage divider, effectively multiplying the $V_{BE}$ of transistor 266 by (R1+R2)/R2, as is well known in the art.

The collector terminal and the base terminal of the transistor 258 are coupled together at node 256, thereby forming a diode. The voltage drop, $V_{BE}$, across the transistor 258 therefore provides another voltage drop equal to $V_{BE}$ between node 256 and the resistor 262. Therefore, there is an approximate voltage drop of approximately nine (9) $V_{BE}$ between node 256 and system ground before transistor 266 conducts (8.2 $V_{BE}$ of transistor 266 (due to the resistors 262 and 264)+$V_{BE}$ of transistor 258). The voltage drop between node 256 and ground is determined by the structure of the transistors 258 and 266, and by the values of the resistors 262 and 264, and is configurable based on system design requirements.

In accordance with the operation of an embodiment of the system for power amplifier over-voltage protection, when the transmit enable signal on connection 152 is logic high, the output of the inverter 254 is logic high and causes the system voltage, $V_{DD}$, on connection 234 to appear at node 256. When the voltage on connection 256 exceeds the voltage necessary to turn-on transistor 266 (i.e., when the system voltage, $V_{DD}$, is sufficient that the output of the voltage divider of resistors 262 and 264 at node 265 is greater than or equal to the $V_{BE}$ of transistor 266, in this example approximately nine (9) $V_{BE}$), transistor 266 conducts to cause the voltage at node 268 to be pulled towards ground, thereby preventing the power amplifier control signal on connection 228 from turning transistor 232 on. This prevents bias current from reaching power amplifier 154 in an overvoltage condition, all the while the collector terminal of the power amplifier 154 remains coupled through the inductor 244 to the system voltage, $V_{DD}$, on connection 234. In other words when the supply voltage $V_{DD}$ to the power amplifier 154 exceeds a certain predetermined level (in this case approximately nine $V_{BE}$, which causes the node 268 to be drawn toward ground at a $V_{DD}$ of approximately 5.4 V), the transistor 266 becomes conductive and pulls the voltage at node 268 to system ground, overriding the error signal on connection 226 present at the input of the filter 218. For comparison, a nominal supply voltage is 3.5V at nominal room temperature.

In this example, above a system voltage, $V_{DD}$, of 5.4V, the bias signal on connection 228 is drawn to ground, whereby the transistor 232 becomes non-conducting between its gate and source terminals, thereby preventing the bias signal from reaching the power amplifier 154. As temperature increases, the value of $V_{BE}$ of transistors 258 and 266 decreases to approximately 0.5V, such that nine $V_{BE}$ decreases to approximately 4.5V. Therefore, under such circumstances, the value of $V_{DD}$ at which the power amplifier over-voltage disable circuit 250 acts to reduce the bias provided to the power amplifier 154 drops to approximately 4.5V.

Regardless of the temperature, the point at which the voltage at node 268 pulls the gate of the transistor 232 to ground can be abrupt or gradual, and is determined by the characteristics of the transistor 266. Generally, when implemented as a high gain NPN device, the transistor 266 abruptly pulls the node 268 to ground. However, the response of the transistor 266 can be adjusted by controlling the degeneration of the transistor 266 to influence its turn on time. Degeneration of the transistor 266 places resistance in the emitter path to ground, thus reducing the transconductance (i.e., the change of output current as a function of the change of the input voltage) of the transistor 266. As the turn-on threshold of the transistor 266 is reached, the transistor 266 will begin to draw current. Degeneration dictates a greater change in the base voltage of the transistor 266 before the transistor 266 turns on and causes the bias voltage at node 268 to be brought low, thus slowing the turn on time of the transistor 266 relative to a non-degenerated device. Adjusting the degeneration in the transistor 266 can make its response more gradual with respect to a non-degenerated device.

In this manner, a voltage condition above a predetermined level of $V_{DD}$ on connection 234 will cause the power amplifier over-voltage disable circuit 250 to disable the power amplifier 154 and prevent over-voltage damage.

Figure 3:
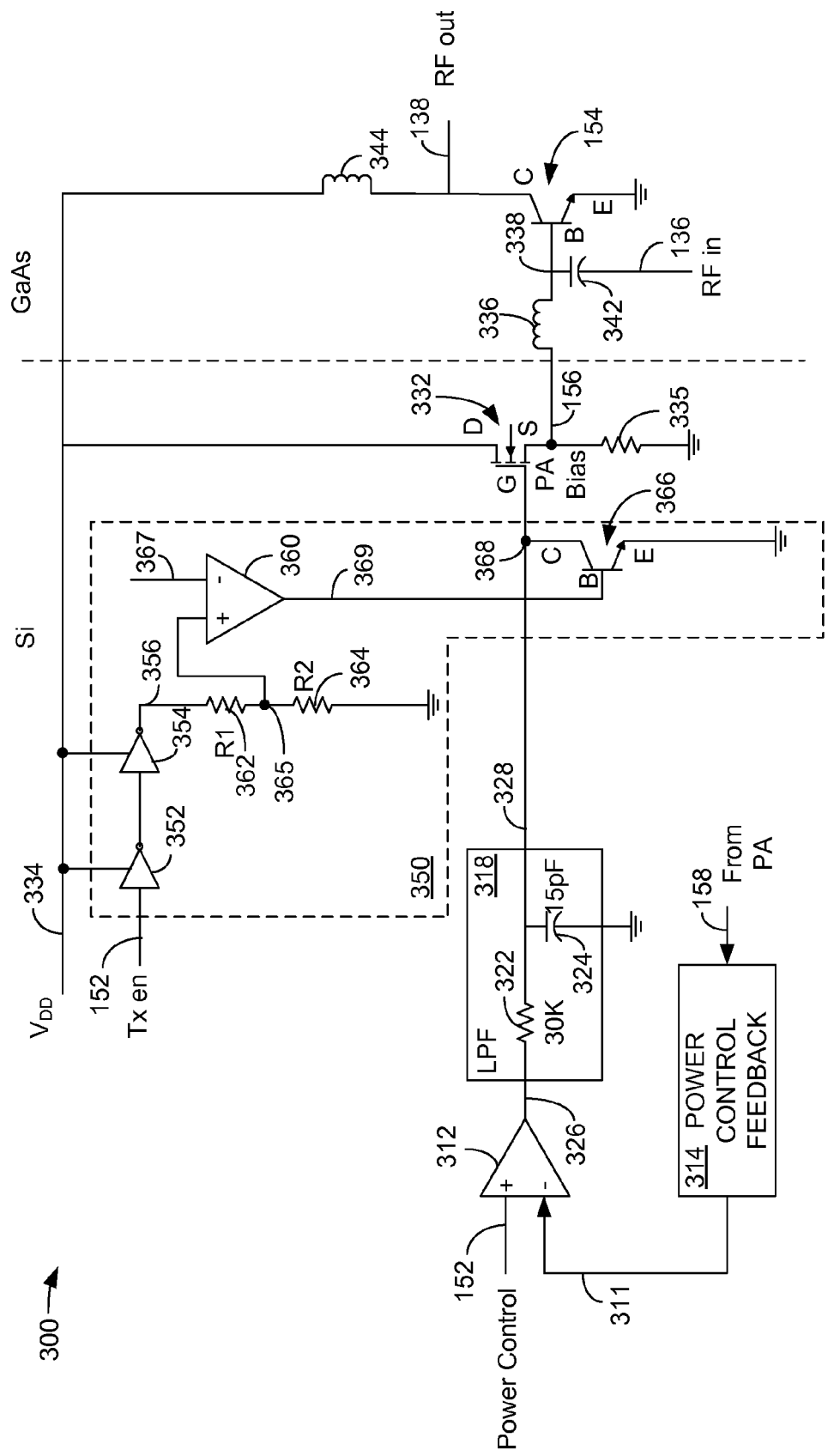
FIG. 3 is a diagram illustrating an alternative embodiment of the power control element and power amplifier of FIG. 1.

FIG. 3 is a diagram illustrating an alternative embodiment of the power control element and power amplifier of FIG. 1. Elements in FIG. 3 that are similar to elements in FIG. 2 will not be described in detail and are numbered using the convention 3XX, where "XX" refers to a corresponding element in FIG. 2.

The power amplifier control element 310 includes a power amplifier over-voltage disable circuit 350. The power amplifier over-voltage disable circuit 350 includes an inverter 352 coupled to an inverter 354. The input signal to the inverter 352 is the transmit enable (Tx en) signal provided from the baseband subsystem 110 over connection 152. The inverter 352 and the inverter 354 also receive the system voltage, $V_{DD}$, over connection 334. When the transmit enable signal on connection 152 is logic high, the inverter 354 provides the system voltage, $V_{DD}$, from connection 334 directly to the output of the inverter 354 on connection 356.

The power amplifier over-voltage disable circuit 350 includes a transistor 366, a comparator 360, and a voltage divider formed by resistors 362 and 364. The collector terminal of the transistor 366 is coupled via node 368 to the gate terminal of the transistor 332. The transistor 332 is similar to the transistor 232 in that it provides the power amplifier bias signal on connection 156. When forward biased, the transistor 366 becomes conducting and a voltage drop $V_{BE}$, appears across the base to emitter junction of the transistor 366, thus pulling the voltage at node 368 toward system ground, as described above with regard to the transistor 266 in FIG. 2.

The comparator 360 can be implemented using an operational amplifier having an inverting and a non-inverting input and which develops an error signal that represents the difference between the inverting and non-inverting inputs. A bandgap reference voltage having an exemplary value of 1.2V can be provided to the inverting input over connection 367. The bandgap reference voltage is dependent upon the material system with which the power amplifier over-voltage disable circuit 350 is fabricated. A scaled version of the system voltage, $V_{DD}$, can be provided to the non-inverting input of the comparator 360 at node 365. The voltage at node 365 is $V_{DD}$* R2/R1+R2. In an embodiment, the value of the resistor 362 is 33 KΩ and the value of the resistor 364 is 10 KΩ such that the voltage at node 365 is approximately 0.8V at a nominal system voltage, $V_{DD}$, of 3.5V. The threshold voltage at which the power amplifier over-voltage disable circuit 350 operates to limit the bias supplied to the power amplifier 154 can be controlled by maintaining the reference voltage on connection 367 constant, and by careful selection of the values of the resistors 362 and 364 to selectably scale the system voltage, $V_{DD}$, at node 334 to a scaled voltage at node 365, and thereby control the threshold at which the comparator 360 forward biases the transistor 366 and interrupts the bias signal at node 368. To provide temperature compensation, the reference voltage may vary with temperature.

The output of the comparator 360 on connection 369 is coupled to the base terminal of the transistor 366. In accordance with the operation of the system for power amplifier over-voltage protection, when the transmit enable signal on connection 152 is logic high, the output of the inverter 354 is logic high and causes the system voltage, $V_{DD}$, on connection 234 to appear at node 356. The system voltage, $V_{DD}$, on connection 356 is divided by the resistors 362 and 364 such that a scaled version of $V_{DD}$ appears at node 365. When the value of the voltage on node 365 exceeds the value of the bandgap voltage provided on connection 367, the output of the comparator 360 on connection 369 generates a voltage that causes the transistor 366 to become conductive. When the transistor 366 becomes conductive, it pulls the voltage at node 368 to system ground, thus overriding the error signal on connection 326 present at the input of the filter 318. In other words when a scaled version of the supply voltage $V_{DD}$ (approximately $V_{DD}$/4 in this example, where $V_{DD}$ has risen to an exemplary value of 4.8V and the scaled version of $V_{DD}$ approaches 1.2V) exceeds a certain predetermined level (in this case the bandgap voltage of 1.2V), then the bias signal on connection 328 is shunted to ground via node 368, thereby disabling the power amplifier 154.

In this manner, a voltage condition above a predetermined level of $V_{DD}$ on connection 334 will cause the power amplifier over-voltage disable circuit 350 to disable the power amplifier 154 and prevent over-voltage damage.

Figure 4:
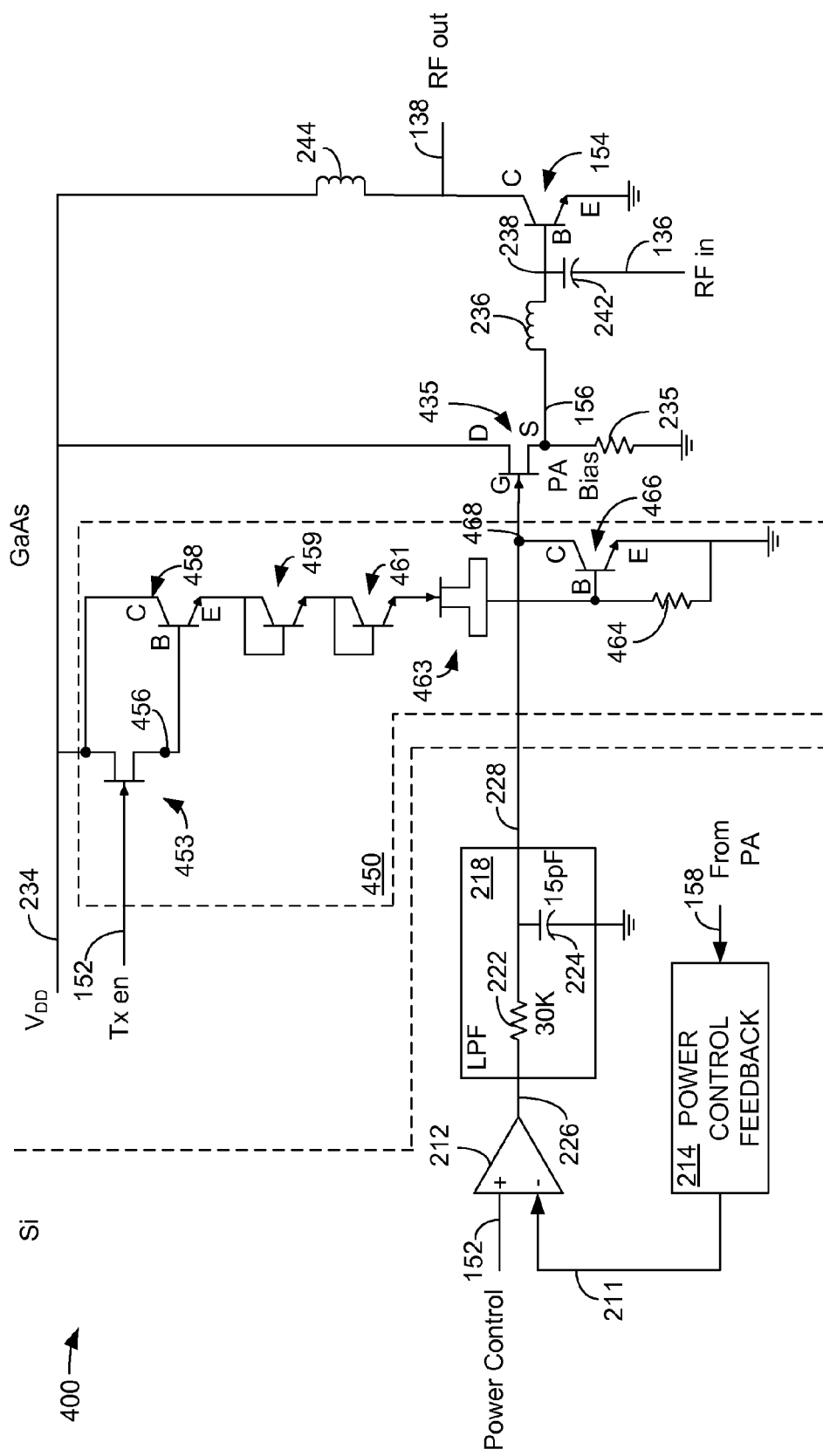
FIG. 4 is a diagram illustrating an alternative embodiment of the power control element and power amplifier of FIG. 2.

FIG. 4 is a diagram illustrating an alternative embodiment of the power control element and power amplifier of FIG. 2. The embodiment shown in FIG. 4 is similar to the embodiment shown in FIG. 2 in which like elements will be identically numbered. The embodiment shown in FIG. 4 illustrates a gallium arsenide (GaAs) implementation of the power amplifier over-voltage disable circuit in which the power amplifier over-voltage disable circuit 450 is fabricated using the same material system and process used to fabricate the power amplifier 154.

The power amplifier over-voltage disable circuit 450 comprises a FET 453, bipolar transistors 458, 459, 461 and 466, and a FET 463. The transistor 453 and the transistor 463 can each be implemented as an n-type metal semiconductor field effect transistor (MESFET). In the embodiment illustrated in FIG. 4, the transistor 435 is also implemented as an n-type MESFET. When turned on by the Tx en signal on connection 152, the transistor 453 connects the system voltage, $V_{DD}$, to node 456 and to the base of the transistor 458.

The transistors 458, 459 and 461 are connected as diodes such that each diode-connected transistor 458, 459 and 461 provides a diode voltage drop of approximately 1.3V when implemented in the GaAs material system.

The FET 463 includes a Schottky diode between its gate and drain-source, having an approximate 0.6V voltage drop, referred to as $V_{DIODE}$. The combination of transistors 458, 459, 461 and 463 provides an approximate 4.5V voltage drop between the node 456 and the base of the transistor 466.

When forward biased, the transistor 466 becomes conducting and a voltage drop $V_{BE}$, appears across the base to emitter junction of the transistor 466, as described above with respect to the transistor 266 in FIG. 2. This voltage drop, $V_{BE}$, also appears across the resistor 464. In an embodiment, the value of the resistor 464 is approximately 8 KΩ.

In accordance with the operation of an embodiment of the system for power amplifier over-voltage protection, when the transmit enable signal on connection 152 is logic high, the FET 453 is turned on and causes the system voltage, $V_{DD}$, on connection 234 to appear at the base of transistor 458 at node 456 and turn on the transistor 458. When the value of the system voltage $V_{DD}$ on the collector of the transistor 458 exceeds the total voltage drop across the transistors 458, 459, 461, 466 and 463, (e.g., the $V_{BE}$ (1.3V) of 458+$V_{BE}$ (1.3V) of 459+$V_{BE}$ (1.3V) of 461+$V_{BE}$ (1.3V) of 466+$V_{DIODE}$ (0.6V) of 463, in this example), the current flowing through the transistor 466 causes the voltage at node 468 to be pulled towards system ground, thereby preventing the power amplifier control signal on connection 228 from allowing the transistor 435 to bias the power amplifier 154. As temperature increases, the value of $V_{BE}$ decreases to approximately 4.5V. Regardless of the temperature, the point at which the voltage at node 468 pulls the gate of the transistor 435 to ground can be abrupt or gradual, and is determined by the degeneration characteristics of the transistor 466.

In this manner, a voltage condition above a predetermined level of $V_{DD}$ on connection 234 will cause the power amplifier over-voltage disable circuit 450 to interrupt the bias signal provided to the power amplifier 154 and prevent over-voltage damage, while the power amplifier 154 remains coupled through the inductor 244 to the system voltage, $V_{DD}$, on connection 234.

Figure 5:
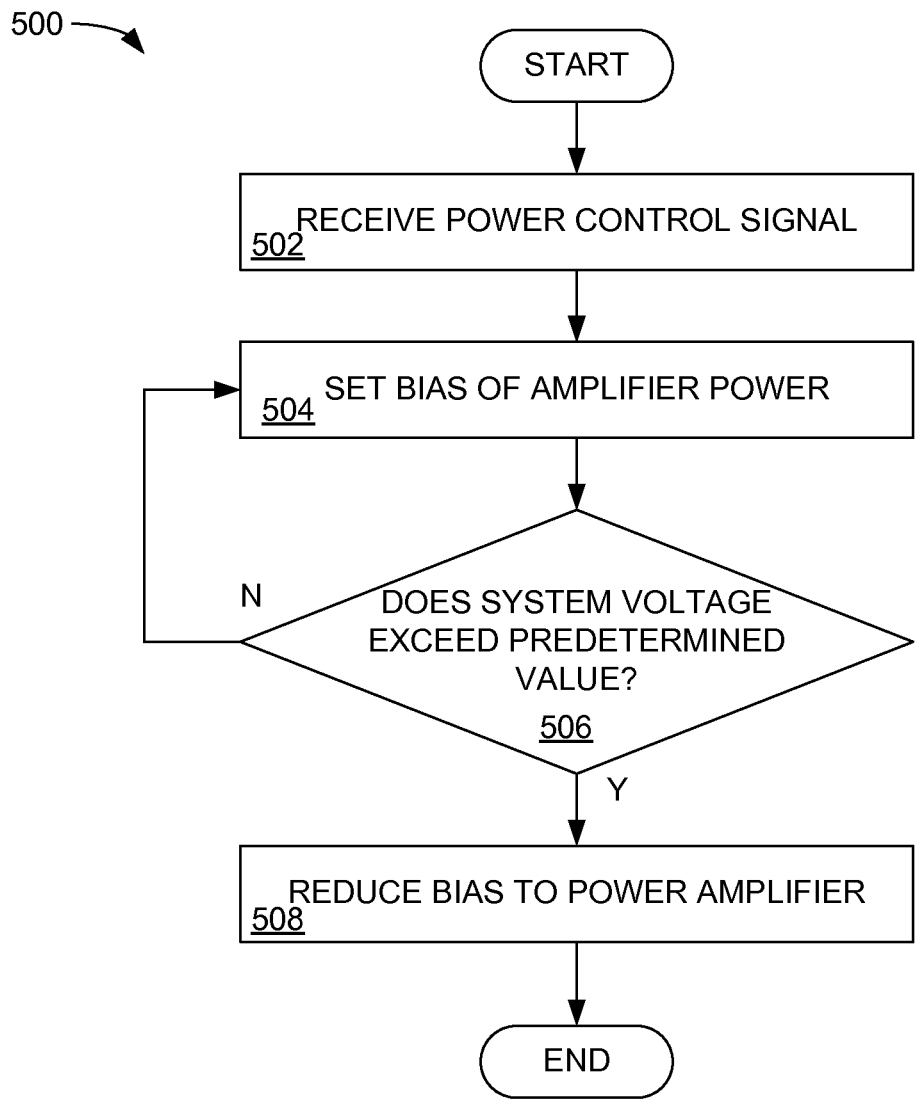
FIG. 5 is a flow chart illustrating an embodiment of a method for power amplifier over-voltage protection.

FIG. 5 is a flow chart illustrating an embodiment of a method for power amplifier over-voltage protection. The blocks in the flow chart illustrate an exemplary method and can be performed in or out of the order shown. Portions of the method for power amplifier over-voltage protection can be executed in software as known in the art.

In block 502, a power control signal is received by the power control element. In block 504, the power control element sets the bias of the power amplifier 154. In block 506 it is determined whether the system voltage, $V_{DD}$, provided to the power amplifier 154 exceeds a predetermined value. If the system voltage, $V_{DD}$, provided to the power amplifier 154 does not exceed a predetermined value, then the process returns to block 504 and the bias signal continues to bias the power amplifier 154. If it is determined in block 506 that the system voltage, $V_{DD}$, provided to the power amplifier 154 exceeds a predetermined value, then the power amplifier over-voltage disable circuit 250 (or 350 or 450) reduces the level of the bias signal provided to the power amplifier, thus preventing or minimizing over-voltage damage to the power amplifier 154, while the power amplifier 154 remains coupled to the system voltage, $V_{DD}$, on connection 234.

While various embodiments of the invention have been described, it will be apparent to those of ordinary skill in the art that many more embodiments and implementations are possible that are within the scope of the invention. For example, the invention is not limited to a specific type of communication device or transceiver. Embodiments of the invention are applicable to different types of communication devices and transceivers.

What is claimed is:

1. A system for power amplifier over-voltage protection, comprising:
   a power amplifier configured to receive a radio frequency (RF) signal, amplify the RF signal and output the amplified RF signal, the power amplifier further configured to receive a system voltage;
   a bias circuit configured to provide a bias signal to the power amplifier; and
   a power amplifier over-voltage circuit configured to interrupt the bias signal when the system voltage exceeds a predetermined value, while the system voltage remains coupled to the power amplifier.

2. The system of claim 1 in which the power amplifier over-voltage circuit includes a transistor device configured to reduce the bias signal when the transistor device enters a conducting state.

3. The system of claim 2 in which the interruption of the bias signal is configured to be capable of being controlled by adjusting degeneration of the transistor device.

4. The system of claim 2 in which the power amplifier over-voltage circuit further includes circuitry to develop the predetermined value.

5. The system of claim 4 in which the circuitry to develop the predetermined value includes at least one diode and at least one resistance configured to develop a voltage drop corresponding to the predetermined value.

6. The system of claim 4 in which the circuitry to develop the predetermined value includes a voltage divider and a comparator.

7. The system of claim 6 in which the voltage divider is configured to develop a selectable scaled voltage.

8. A system for power amplifier control, comprising:
   a power amplifier configured to receive a system voltage and a radio frequency (RF) input, the power amplifier configured to provide an RF output;
   a bias circuit configured to provide a bias signal to the power amplifier, the bias signal relating to the RF output;
   a power control feedback element configured to receive a signal representative of the RF output of the power amplifier, the power control feedback element configured to provide a power control feedback signal;
   a comparator configured to receive the power control feedback signal and a power control signal, the comparator configured to provide an error signal used to develop the bias signal; and
   a power amplifier over-voltage circuit configured to interrupt the bias signal when the system voltage exceeds a predetermined value, while the system voltage remains coupled to the power amplifier.

9. The system of claim 8 in which the power amplifier over-voltage circuit includes a transistor device configured to reduce the bias signal when the transistor device enters a conducting state.

10. The system of claim 9 in which the interruption of the bias signal is configured to be capable of being controlled by adjusting degeneration of the transistor device.

11. The system of claim 9 in which the power amplifier over-voltage circuit further includes circuitry to develop the predetermined value.

12. The system of claim 11 in which the circuitry to develop the predetermined value includes at least one diode and at least one resistance configured to develop a voltage drop corresponding to the predetermined value.

13. The system of claim 11 in which the circuitry to develop the predetermined value includes a voltage divider and a comparator.

14. The system of claim 13 in which the voltage divider is configured to develop a selectable scaled voltage.

15. A portable communication device, comprising:
- a transmitter configured to develop a radio frequency (RF) communication signal;
- a receiver configured to receive an RF communication signal;
- a power amplifier configured to receive a system voltage and the RF communication signal from the transmitter, the power amplifier configured to provide an RF output;
- a bias circuit configured to provide a bias signal to the power amplifier, the bias signal relating to the RF output;
- a power control feedback element configured to receive a signal representative of the RF output of the power amplifier, the power control feedback element configured to provide a power control feedback signal;
- a comparator configured to receive the power control feedback signal and a power control signal, the comparator configured to provide an error signal used to develop the bias signal; and
- a power amplifier over-voltage circuit configured to interrupt the bias signal when the system voltage exceeds a predetermined value, while the system voltage remains coupled to the power amplifier.

16. The portable communication device of claim 15 in which the power amplifier over-voltage circuit includes a transistor device configured to reduce the bias signal when the transistor device enters a conducting state, and circuitry to develop the predetermined value.

17. The portable communication device of claim 16 in which the interruption of the bias signal can be controlled by adjusting degeneration of the transistor device.

18. The portable communication device of claim 16 in which the circuitry to develop the predetermined value includes at least one diode and at least one resistance configured to develop a voltage drop corresponding to the predetermined value.

19. The portable communication device of claim 16 in which the circuitry to develop the predetermined value includes a voltage divider and a comparator.

20. The portable communication device of claim 19 in which the voltage divider is configured to develop a selectable scaled voltage.

21. The system of claim 1 in which the power amplifier includes a power amplifier transistor having a base and a collector, the base configured to receive the RF signal, the collector configured to output the amplified RF signal, the collector further configured to receive the system voltage.

22. The system of claim 21 in which at least the power amplifier transistor is implemented on a gallium arsenide (GaAs) substrate.

23. The system of claim 22 in which the power amplifier transistor and at least a portion of the power amplifier over-voltage circuit are implemented on the GaAs substrate.

* * * * *